(12) United States Patent
Yoon et al.

(10) Patent No.: US 10,007,132 B2
(45) Date of Patent: Jun. 26, 2018

(54) DISPLAY PANEL COMPRISING FIRST AND SECOND SUBSTRATES HAVING CRACK GUIDE GROOVES FORMED ON OUTER SURFACES OF THE FIRST AND SECOND SUBSTRATES FACING AWAY FROM EACH OTHER

(71) Applicant: Samsung Display Co., Ltd., Yongin (KR)

(72) Inventors: Won Gap Yoon, Suwon-si (KR); Ji Eun Jang, Suwon-si (KR); Kyung Seon Tak, Hwaseong-si (KR); Keun Chan Oh, Cheonan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 274 days.

(21) Appl. No.: 14/700,984

(22) Filed: Apr. 30, 2015

(65) Prior Publication Data

US 2016/0124254 A1 May 5, 2016

(30) Foreign Application Priority Data

Nov. 5, 2014 (KR) .......................... 10-2014-0152923

(51) Int. Cl.
*G02F 1/1333* (2006.01)
*G02F 1/13* (2006.01)
*H01L 27/12* (2006.01)

(52) U.S. Cl.
CPC .......... *G02F 1/1333* (2013.01); *G02F 1/1309* (2013.01); *H01L 27/1218* (2013.01)

(58) Field of Classification Search
CPC .......................... H01L 27/1218; G02F 1/1333
See application file for complete search history.

(56) References Cited

U.S. PATENT DOCUMENTS

| | | | |
|---|---|---|---|
| 2006/0230831 A1 | 10/2006 | Berke | |
| 2007/0247731 A1* | 10/2007 | Mizusako | G02F 1/133504 359/872 |
| 2008/0305576 A1* | 12/2008 | Yu | H01L 23/3121 438/107 |
| 2010/0045921 A1* | 2/2010 | Wang | G02F 1/133351 349/153 |
| 2010/0073620 A1 | 3/2010 | Yamaguchi et al. | |
| 2012/0224133 A1* | 9/2012 | Makino | G02F 1/133351 349/153 |

FOREIGN PATENT DOCUMENTS

KR 10-2010-0138167 12/2010
KR 10-2011-0117413 10/2011

\* cited by examiner

*Primary Examiner* — Paul Lee
(74) *Attorney, Agent, or Firm* — H.C. Park & Associates, PLC

(57) ABSTRACT

Provided are a display panel and a thin film transistor array substrate. According to one or more exemplary embodiments, a display panel includes: a first substrate including a pixel area and a non-pixel area; a second substrate that faces the first substrate; and a crack guide groove disposed on a surface of at least one of the first substrate and the second substrate.

9 Claims, 13 Drawing Sheets

DISPLAY PANEL COMPRISING FIRST AND SECOND SUBSTRATES HAVING CRACK GUIDE GROOVES FORMED ON OUTER SURFACES OF THE FIRST AND SECOND SUBSTRATES FACING AWAY FROM EACH OTHER

CROSS-REFERENCE TO RELATED APPLICATION

This application claims priority from and the benefit of Korean Patent Application No. 10-2014-0152923, filed on Nov. 5, 2014, which is hereby incorporated by reference for all purposes as if fully set forth herein

BACKGROUND

Field

Exemplary embodiments relate to a display panel and a thin film transistor array substrate included in the same.

Description

Display devices include a liquid crystal display, a field emission display, a plasma display, and an organic light emitting display. Such display devices are provided in video display appliances, such as TVs and computer monitors, and serve to display moving images and static images including various kinds of images and text.

A liquid crystal display is a display device which controls the quantity of light that penetrates a liquid crystal layer interposed between electrodes (i.e., a pixel electrode and a common electrode) respectively formed on two substrates that face each other by controlling the orientation of liquid crystal molecules of the liquid crystal layer through voltages applied to the electrodes.

Since liquid crystal displays include non-light-emitting elements and do not provide a self-emitting element, that is, where a display panel includes non-self-luminous substrates, a liquid crystal display can requires a backlight unit for supplying light to the display panel. Accordingly, the liquid crystal display is manufactured through the combination of the display panel and the backlight unit.

A display panel may bend due to an external impact that is caused by various reasons, e.g., the fall of the display panel or the like, when the display panel is transported to a space to combine the display panel and the backlight unit to each other or after the display panel and the backlight unit are combined. Further, in a process of fastening the display panel and the backlight unit to each other, the display panel may bend when excessive fastening pressure is applied to the display panel.

If such a bending causes a deformation of the display panel, stresses may be generated on the display panel, and this may cause an image that is displayed on the display panel to be distorted after the display apparatus is manufactured and operated. However, since the bending deformation of the display panel may not be easily recognized during the manufacturing process, the display panel that may display a distorted image cannot be determined until a final test after manufacturing of the display device is completed, or may be found by a user after shipment of the display device. In this case, the display panel may be recalled.

In the case where the display panel that may display the distorted image is not identified during the manufacturing process of the display device, the manufacturing time and manufacturing costs may be wasted due to such an unproductive process of manufacturing the display panel. Thus, easier ways to detect a defect in the manufacturing process may reduce the unproductive manufacturing problems.

The above information disclosed in this Background section is only for enhancement of understanding of the background of the inventive concept, and, therefore, it may contain information that does not form the prior art that is already known in this country to a person of ordinary skill in the art.

SUMMARY

One or more exemplary embodiments provide a process of manufacturing a display panel.

Additional aspects will be set forth in the detailed description which follows, and, in part, will be apparent from the disclosure, or may be learned by practice of the inventive concept.

One or more exemplary embodiments provide a display panel including: a first substrate including a pixel area and a non-pixel area; a second substrate that faces the first substrate; and a crack guide groove disposed on a surface of at least one of the first substrate and the second substrate.

One or more exemplary embodiments provide a thin film transistor array substrate including: a substrate including a pixel area and a non-pixel area; a thin film transistor disposed on the substrate; a first electrode disposed on the substrate in an area corresponding to the pixel area, the first electrode being electrically connected to the thin film transistor; and at least one crack guide groove disposed on a surface of the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
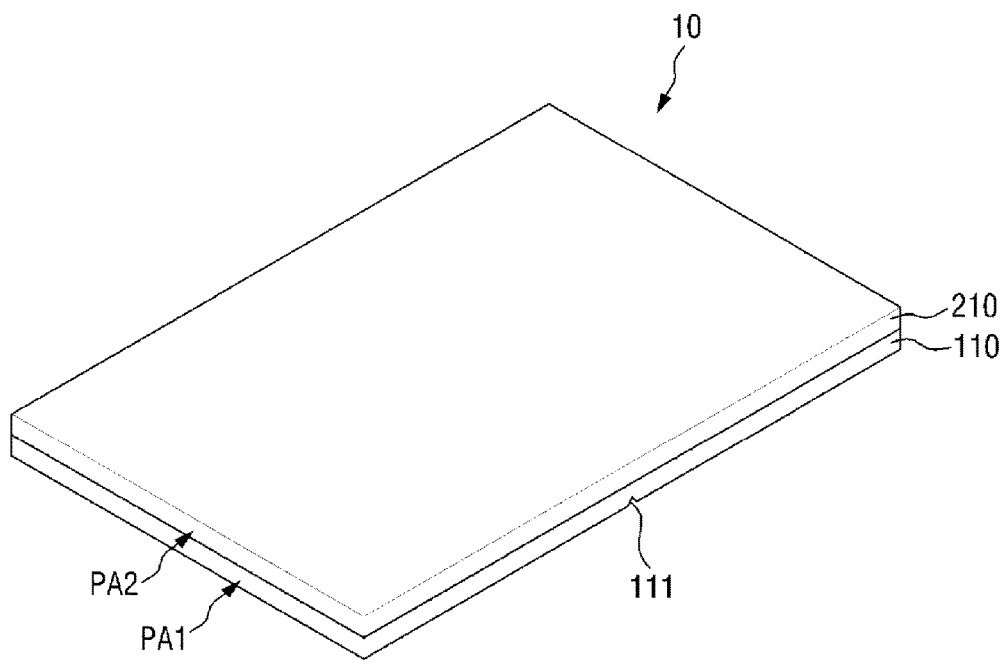
FIG. 1 is a perspective view of a display panel in a bonded state, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

One or more exemplary embodiments provide a display panel and a thin film transistor array substrate, which provide a way to detect a defect during a process of manufacturing a display device. A crack guide groove may be formed on a surface of a first substrate, and if a bending deformation of a display panel occurs during the process of manufacturing the display device, a crack may be formed on the first substrate so that the crack can be easily recognized and the first substrate can be discarded before further processing. Accordingly, the display panel that may have a defect by an excessive bending in the process of manufacturing the display device may be identified in early manufacturing stages.

Figure 2:
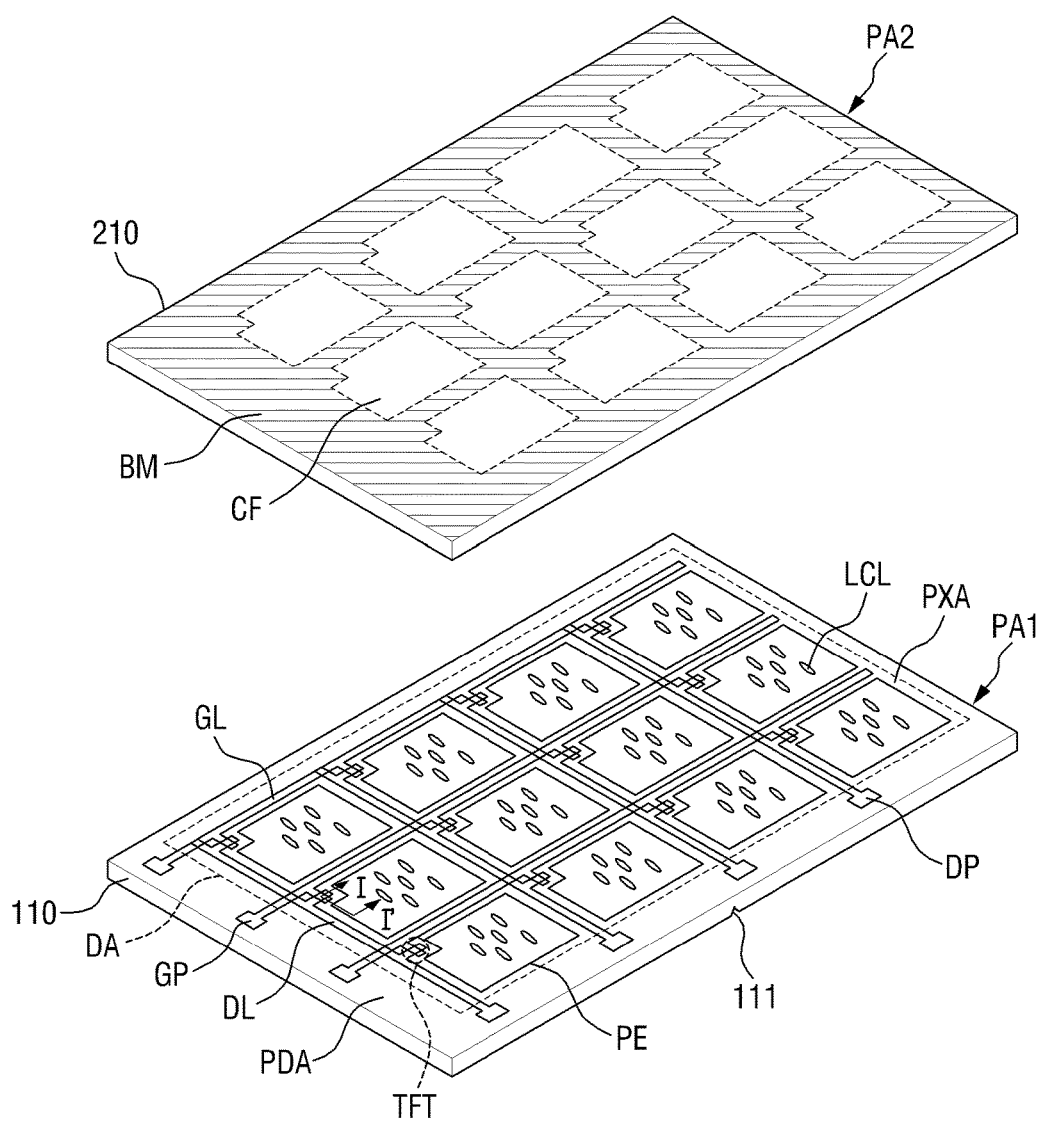
FIG. 2 is a perspective view of the display device of FIG. 1 in a separated state, according to one or more exemplary embodiments.
Figure 3:
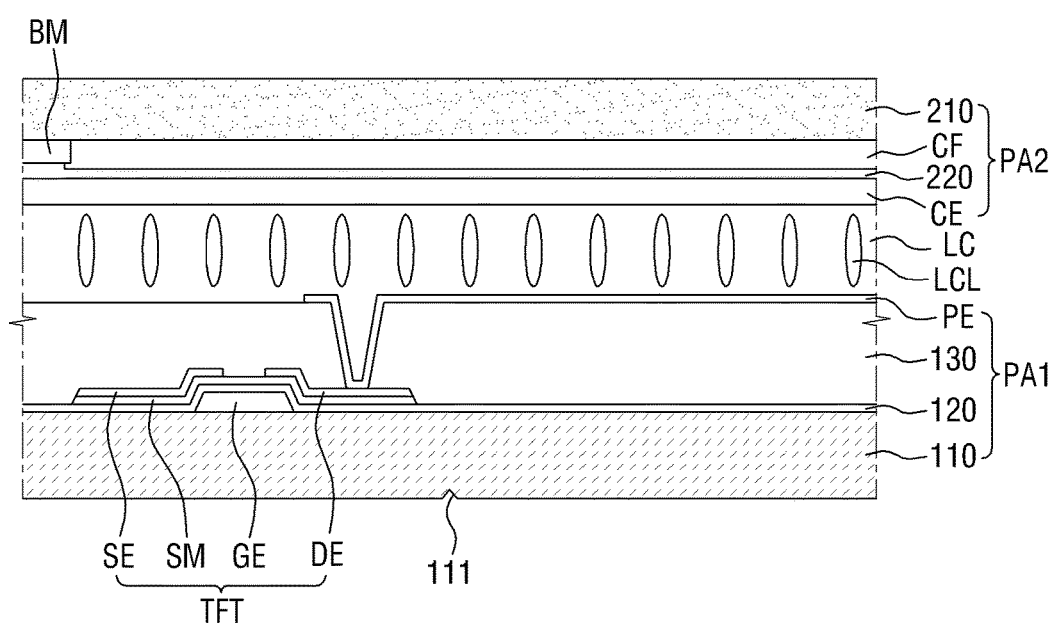
FIG. 3 is a cross-sectional view of the display panel of FIG. 2 taken along line I-I' of FIG. 2, according to one or more exemplary embodiments.

FIG. 1 is a perspective view of a display panel in a bonded state, according to one or more exemplary embodiments. FIG. 2 is a perspective view of the display device of FIG. 1 in a separated state, according to one or more exemplary embodiments. FIG. 3 is a cross-sectional view of the display panel of FIG. 2 taken along line I-I' of FIG. 2, according to one or more exemplary embodiments.

Display panel 10 may include a plurality of pixels to display an image. Although not specially limited to the following examples, display panel 10 may be, for example, a display panel of a liquid crystal display, an organic light emitting display, an electrophoretic display, an electrowetting display, or a MEMS (Micro Electro Mechanical System) display. FIG. 1 to FIG. 3 illustrate a display panel of a liquid crystal display as an example of display panel 10.

Referring to FIG. 1 to FIG. 3, display panel 10 may include first panel PA1, second panel PA2 that faces first panel PA1, and liquid crystal layer LC disposed between first panel PA1 and second panel PA2.

First panel PA1 may include first substrate 110, at least one gate line GL, at least one data line DL, agate pad GP, data pad DP, gate insulating layer 120, at least one thin film transistor TFT, insulating layer 130, and pixel electrode PE.

First substrate 110 (first substrate 110 may be referred to as a thin film transistor array substrate) may include a material having superior permeability, heat resistance, and chemical resistance. For example, first substrate 110 may include any one of glass, polyethylenenaphthalate, polyethyleneterephthalate, and polyacryl, which have superior light permeability.

First substrate 110 may include display area DA, and pad area PDA that is provided on at least one side of display area DA. Display area DA is an area where an image is displayed, and may include at least one pixel area PXA which is defined by gate lines GL and data lines DL, and non-pixel area which is the remaining area other than pixel area PXA within display area DA. In the non-pixel area, gate lines GL and data lines DL are arranged. In pixel area PXA, thin film transistor TFT and pixel electrode PE that is connected to thin film transistor TFT may be arranged. Pad area PDA may be arranged in a non-display area in which the image not displayed. Pad area PDA may be the peripheral area that surrounds display area DA as shown in FIG. 2.

First substrate 110 may be in a flat shape, e.g., in a plate shape, and may include crack guide groove 111 formed on a surface thereof. Crack guide groove 111 will be described in detail below.

Gate lines GL are arranged in display area DA of first substrate 110, and respectively extend in one direction. Data lines DL are arranged in display area DA of first substrate 110, respectively extend in a direction that crosses the extending direction of gate lines GL, and may be insulated from gate lines GL.

Gate pad GP is arranged in pad area PDA of first substrate 110, and may be connected to one end of gate lines GL. Data pad DP is arranged in pad area PDA of first substrate 110, and may be connected to one end of data lines DL.

Hereinafter, display area DA will be described in more detail with respect to pixel area PXA.

Gate insulating layer 120 may be arranged in both display area DA and pad area PDA. Gate insulating layer 120 may include an insulating material, and cover gate lines GL, a common line (not illustrated), and gate pad GP, which are formed on the surface of first substrate 110. For example, gate insulating layer 120 may include silicon nitride or silicon oxide. Data lines DL and data pad DP may be formed on gate insulating layer 120. Here, gate insulating layer 120 may have through-holes formed therein to expose the common line (not illustrated) and gate pad GP.

Thin film transistor TFT may be arranged in pixel area PXA. Thin film transistor TFT includes gate electrode GE, semiconductor layer SM, source electrode SE, and drain electrode DE.

Gate electrode GE may be formed to project from the gate line GL to a side of the semiconductor layer SM on a plane. Gate electrode GE may include any one of indium tin oxide (ITO), indium zinc oxide (IZO), and indium tin zinc oxide (ITZO). Further, gate electrode GE may have a two-layered structure that includes a first electrode layer including the above-described material (e.g., indium tin oxide (ITO), indium zinc oxide (IZO), and indium tin zinc oxide (ITZO)), and a second electrode layer including a material to be described later. The second electrode layer may include a metal, such as copper (Cu), molybdenum (Mo), aluminum (Al), tungsten (W), chrome (Cr), or titanium (Ti), or an alloy including at least one of the above-described metals.

Semiconductor layer SM may be formed on gate electrode GE so that gate insulating layer 120 is interposed between semiconductor layer SM and gate electrode GE. Semiconductor layer SM may include an active layer provided on gate insulating layer 120 and an ohmic contact layer provided on the active layer. The active layer may be formed in an area that corresponds to the area in which source electrode SE and drain electrode DE are formed and the area between source electrode SE and drain electrode DE on a plane. The ohmic contact layer may be formed between the active layer and source electrode SE and between the active layer and drain electrode DE. Further, semiconductor layer SM may be formed between data line DL and gate insulating layer 120. Further, semiconductor layer SM may also be formed between data pad DP and gate insulating layer 120.

Source electrode SE may be formed to project from data lines DL, and overlap at least a part of gate electrode GE on a plane. Drain electrode DE may be formed to be spaced apart from source electrode SE, and overlap at least a part of gate electrode GE on a plane. Source electrode SE and drain electrode DE may be formed of a metal, such as copper, molybdenum, aluminum, tungsten, chrome, or titanium, or an alloy that includes at least one of the above-described metals. Here, source electrode SE and drain electrode DE overlap a part of the semiconductor layer SM in an area except for a gap area between source electrode SE and drain electrode DE.

Insulating layer 130 may be arranged in both display area DA and pad area PDA, and may be formed on gate insulating layer 120. Insulating layer 130 has through-holes formed therein to expose drain electrode DE, gate pad GP, and data pad DP. Insulating layer 130 may include an organic material.

Pixel electrode PE may be formed on insulating layer 130 arranged in display area DA, and be connected to drain electrode DE. Pixel electrode PE may include a transparent conductive material, for example, any one of indium tin oxide (ITO), indium zinc oxide (IZO), and indium tin zinc oxide (ITZO).

Second panel PA2 may include second substrate 210, color filter CF, black matrix BM, overcoat layer 220, and common electrode CE.

Second substrate 210 may be formed in a flat shape and face first substrate 110. Second substrate 210 may include a material having superior permeability, heat resistance, and chemical resistance. For example, second substrate 210 may include any one of glass, polyethylenenaphthalate, polyethyleneterephthalate, and polyacryl, which have superior light permeability.

Color filter CF may be formed to correspond to each pixel area PXA on second substrate 210. Color filter CF is to display a color by filtering visible light that permeates liquid crystal layer LC and passes through color filter CF, and may be one of a red (R) filter, a green (G) filter, and a blue (B) filter. However, color filter CF configurations are not limited to those as described above.

Black matrix BM may be formed at an edge of each pixel area PXA on second substrate 210. More specifically, black matrix BM may be formed to surround color filter CF. Black matrix BM may overlap gate lines GL, data lines DL, and thin film transistor TFT. Further, black matrix BM may overlap pad area PDA. Black matrix BM may include a light blocking material and absorb or reflect light so that the area corresponding to black matrix BM prevents light from passing through. For example, black matrix BM can prevent light leakage that may occur at the edge of liquid crystal layer LC or color mixing that may occur at the adjacent edges of color filters CF filtering different colors.

Overcoat layer 220 may be formed on color filter CF and black matrix BM. Overcoat layer 220 may provide planarization, protection, and insulation for color filter CF. Overcoat layer 220 may be formed using acrylic epoxy material, for example.

Common electrode CE may be formed on overcoat layer 220. Common electrode CE receives a common voltage that is transferred through the common line (not illustrated). Further, common electrode CE may be grounded to 0V in certain configurations. Common electrode CE may include a transparent conductive material, for example, IZO (Indium Zinc Oxide) or a-ITO (amorphous Indium Tin Oxide).

In the display device having the above-described structure, thin film transistor TFT is turned on in response to a drive signal that is provided through gate line GL. If thin film transistor TFT is turned on, an image signal that is provided through data line DL is provided to pixel electrode PE through thin film transistor TFT. Accordingly, an electric field may be formed between pixel electrode PE and common electrode CE, and liquid crystals LCL of liquid crystal layer LC are driven in accordance with the electric field to display an image.

Figure 4:
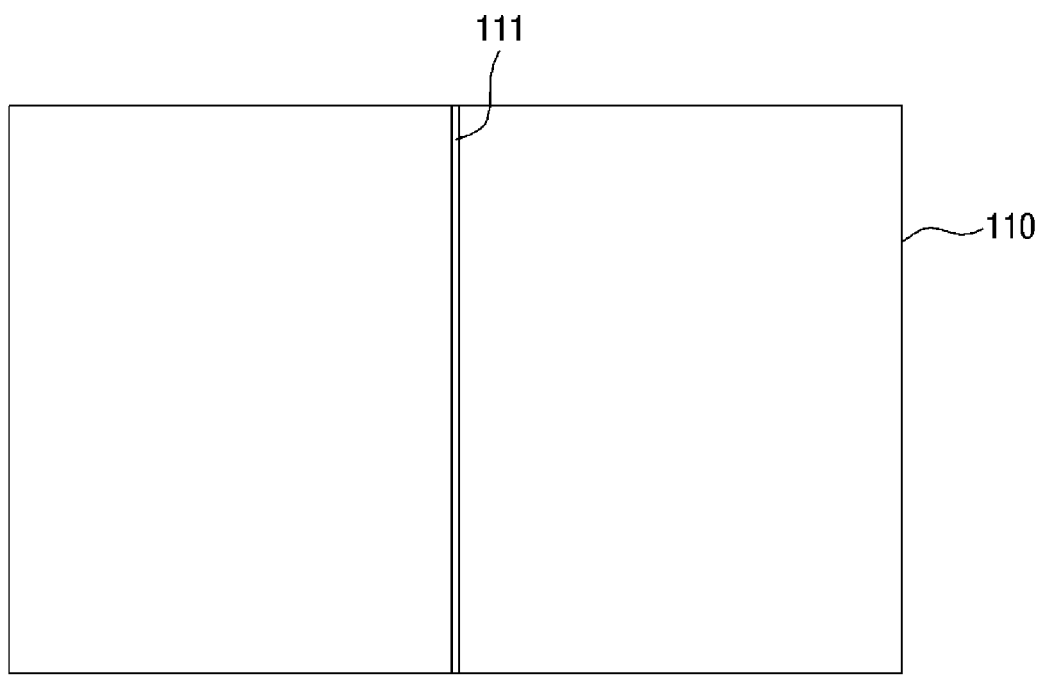
FIG. 4 and FIG. 5 are a plan view and a cross-sectional view of the first substrate of FIG. 2, according to one or more exemplary embodiments.
Figure 5:
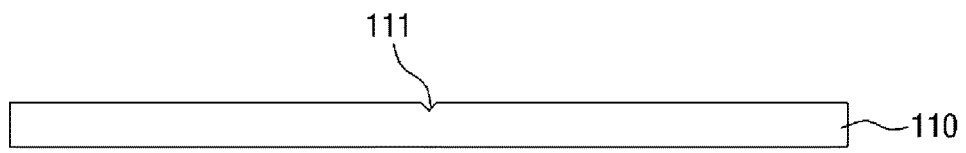
Figure 6:
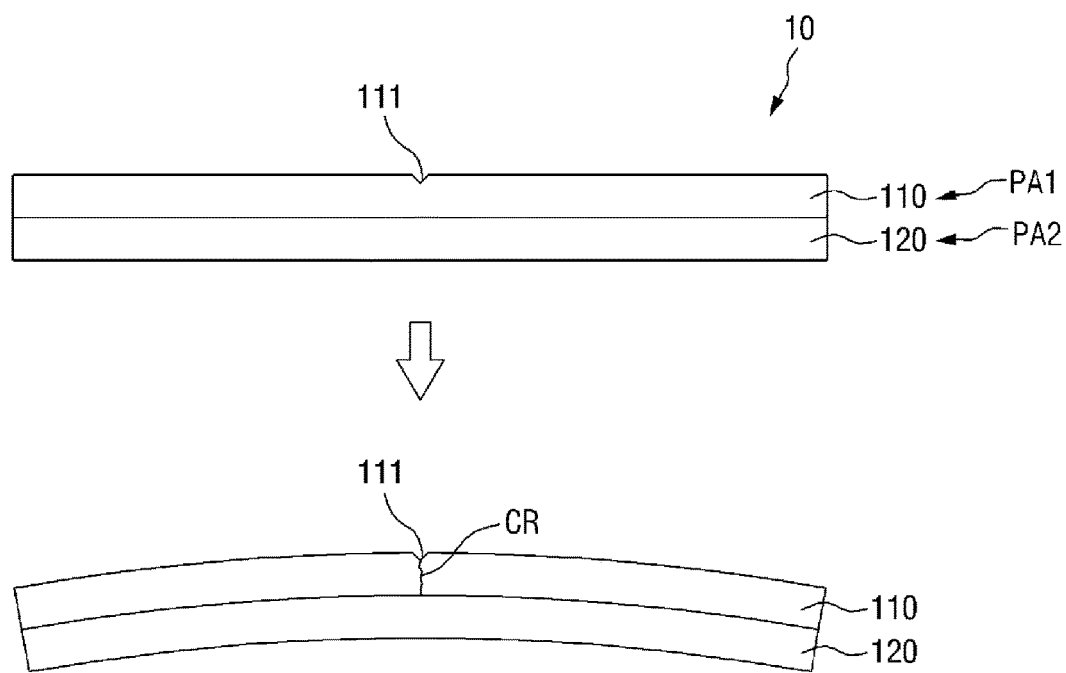
FIG. 6 is a cross-sectional view showing a case where the display panel of FIG. 1 is deformed, according to one or more exemplary embodiments.

FIG. 4 and FIG. 5 are a plan view and a cross-sectional view of the first substrate of FIG. 2, according to one or more exemplary embodiments. FIG. 6 is a cross-sectional view showing a case where the display panel of FIG. 1 is deformed, according to one or more exemplary embodiments.

Referring to FIG. 4 to FIG. 6, crack guide groove 111 may be formed on a surface (i.e., first outer surface) of first substrate 110 that does not face the second substrate 210. Crack guide groove 111 may be formed on the first outer surface of the first substrate 110, and may be formed in a solid line shape along first direction X that is substantially in parallel to the edge or the side surface of first substrate 110. According to one or more exemplary embodiments, first direction X may be a direction that is substantially in parallel to the shorter side of first substrate 110 or a direction that is substantially perpendicular to the longer side of first substrate 110. However, aspects are not limited thereto. In some embodiments, crack guide groove 111 may be positioned along first direction X as illustrated in FIG. 4 to FIG. 6, and may be positioned in a portion that divides first substrate 110 in half. In other words, crack guide groove 111 may be positioned in the center portion of first substrate 110 in second direction Y that is perpendicular to first direction X. First direction X may be a direction that is in parallel to data lines DL of FIG. 2. However, exemplary embodiments are not limited as such, and first direction X may be a direction that is in parallel to gate lines GL of FIG. 2, according to one or more exemplary embodiments.

For example, if the bending deformation of display panel 10 occurs in the process of manufacturing a display device including the display panel 10 as illustrated in FIG. 6, crack guide groove 111 may cause crack CR to be formed in the center portion of first substrate 110, which receives the highest stress when display panel 10 bends. Accordingly, display panel 10 having unwanted bending deformation can be found in early stages in the process of manufacturing the display device. Specifically, first substrate 110 including crack guide groove 111 may generate crack CR when first substrate 110 bends more than a threshold to generate crack CR in a manufacturing process of a display device including first substrate 110. Crack CR can be discovered in an early stage of the manufacturing process so that first substrate 110 having crack CR, which would have a defect of displaying a distorted image when completely manufactured and utilized, may be discarded without further processing. Accordingly, waste of the manufacturing time and manufacturing costs due to an unproductive process of manufacturing a display panel more likely to display a distorted image can be reduced. Crack guide groove 111 may also provide confirmation or counterfeit detection features, as attempts to manufacture a display panel with mismatched substrates can be indicated with crack CR.

The depth of crack guide groove 111 may be equal to or smaller than 1/10 of the thickness of first substrate 110. Accordingly, first substrate 110 can be prevented from being broken by an impact which can generate stresses lower than the stresses that may cause display panel 10 to have the defect of displaying a distorted image. FIG. 5 and FIG. 6 illustrate that the cross-sectional shape of crack guide groove 111 is a triangle. The cross sectional shape of crack guide groove 111 may have various shapes including a rectangular shape, a half circle, and the like.

Figure 7:
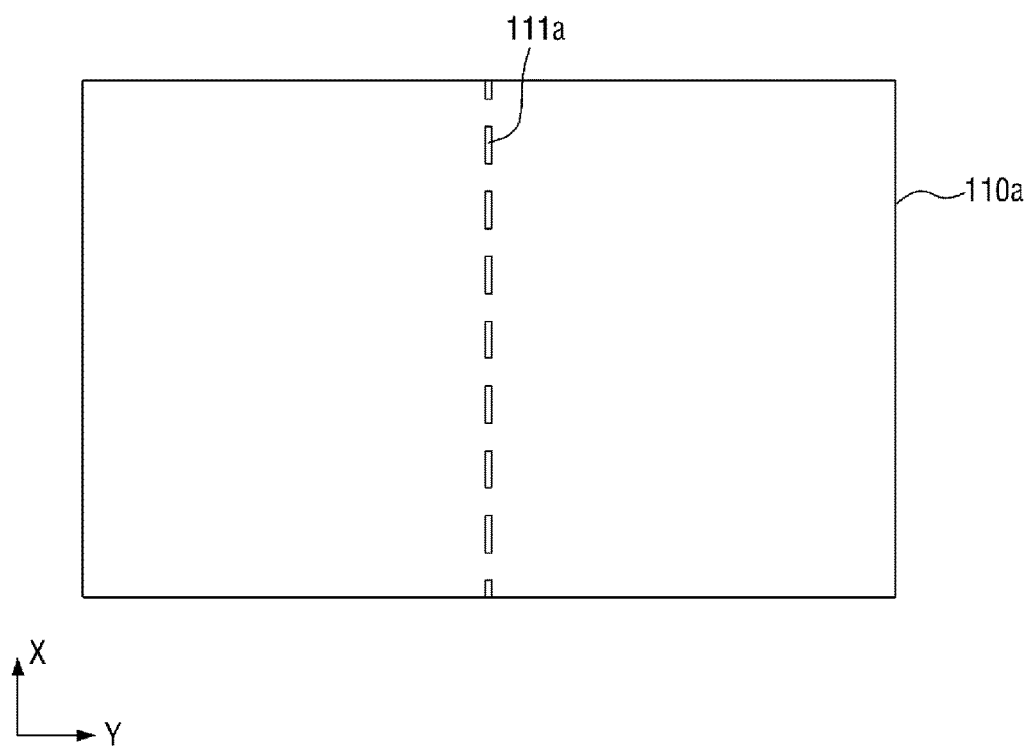
FIG. 7, FIG. 8, and FIG. 9 are plan views showing various exemplary embodiments of the first substrate of FIG. 2.
Figure 8:
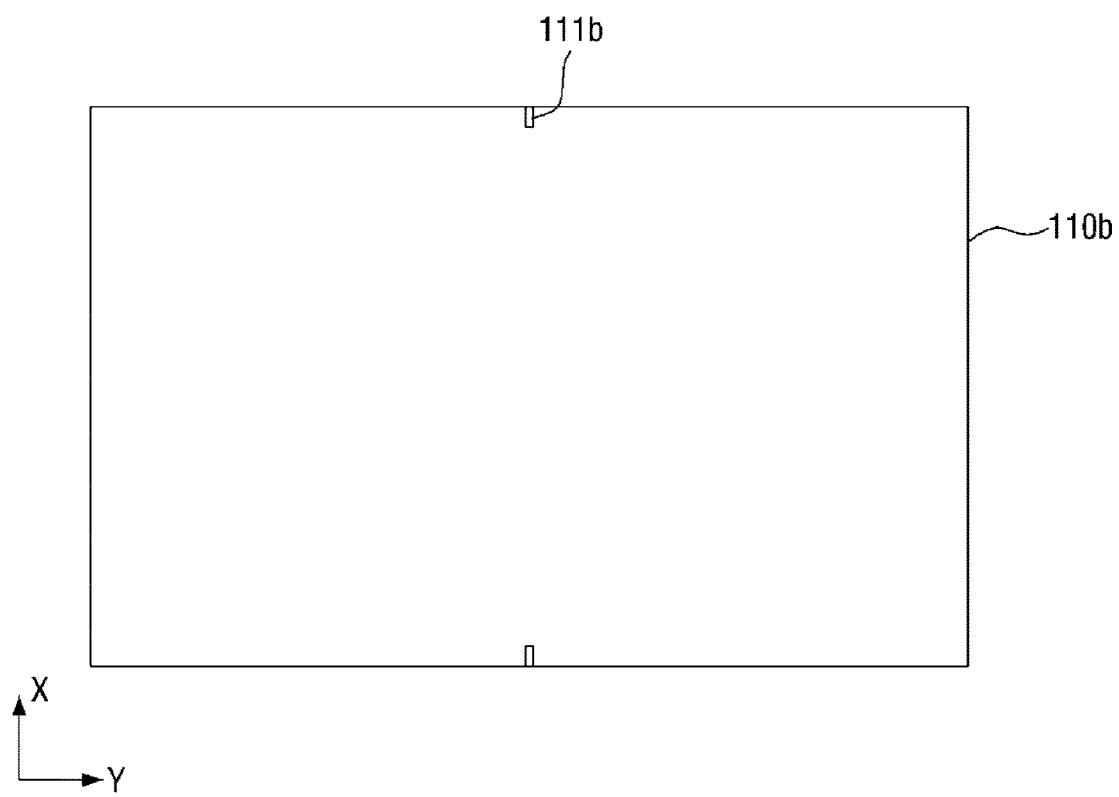
Figure 9:
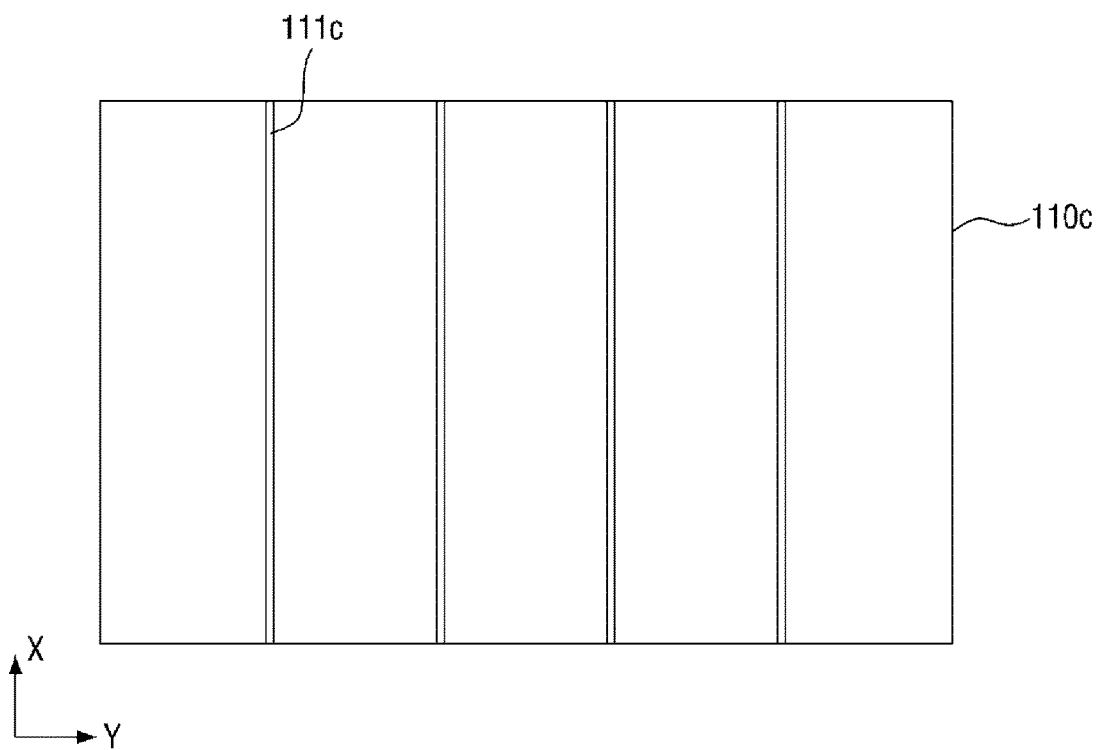

FIG. 7 to FIG. 9 are plan views showing exemplary embodiments of the first substrate of FIG. 2.

Referring to FIG. 7, it is exemplified that first substrate 110a includes crack guide groove 111a in a dotted line shape. Crack guide groove 111a may be formed along first direction X on a surface (i.e., first outer surface) of the first substrate 110a. Such crack guide groove 111a can prevent first substrate 110a from being easily broken by an impact which can generate stresses lower than the stresses that may cause display panel 10 to have the defect of displaying a distorted image. Crack guide groove 111a has a thickness that is thinner than the thickness of first substrate 110 as illustrated in FIG. 4.

FIG. 8 illustrates that first substrate 110b includes crack guide groove 111b in a solid line shape, which is formed at two opposite edge portions along first direction X on a surface (i.e., first outer surface) of first substrate 110b. Such crack guide groove 111b may be formed in a pad area of first substrate 110b, where an image is not displayed, and thus visual recognition of crack guide groove 111b on the first substrate 110b can be prevented or reduced.

FIG. 9 illustrates that first substrate 110c includes crack guide grooves 111c in a solid line shape, which are formed along first direction X on a surface (i.e., first outer surface) of first substrate 110c, and are spaced apart from each other along second direction Y that is perpendicular to first direction X. Such crack guide grooves 111c may facilitate the generation of crack on first substrate 110c when bending deformation of the first substrate 110c occurs, e.g., in the process of manufacturing a display device.

Crack guide grooves 111c may overlap a part of the black matrix BM of FIG. 2. For example, crack guide grooves 111c may overlap data lines DL of FIG. 2. Since crack guide grooves 111c are positioned in an area that corresponds to the non-pixel area, visual recognition of crack guide grooves 111c on first substrate 110c can be reduced or prevented.

FIG. 9 illustrates that crack guide grooves 111c are grooves in a solid line shape, which are formed along first direction X on the surface (i.e., first outer surface) of first substrate 110c. However, crack guide grooves 111c may be implemented as grooves in a dotted line shape similar to crack guide groove 111a of FIG. 7, or may be implemented as grooves in a solid line shape, which are formed in opposite edge portions along the first direction X on the surface (i.e., first outer surface) of first substrate 110c similar to crack guide groove 111b of FIG. 8.

As described above, display panel 10 may include crack guide groove 111 that is formed on the first outer surface of first substrate 110, and if the bending deformation of display panel 10 occurs in the process of manufacturing a display device, crack CR may be formed in the portion of first substrate 110 where the highest stresses are applied. Accordingly, display panel 10 having unwanted bending deformation can be discovered and discarded in early stages in the process of manufacturing a display device.

Figure 10:
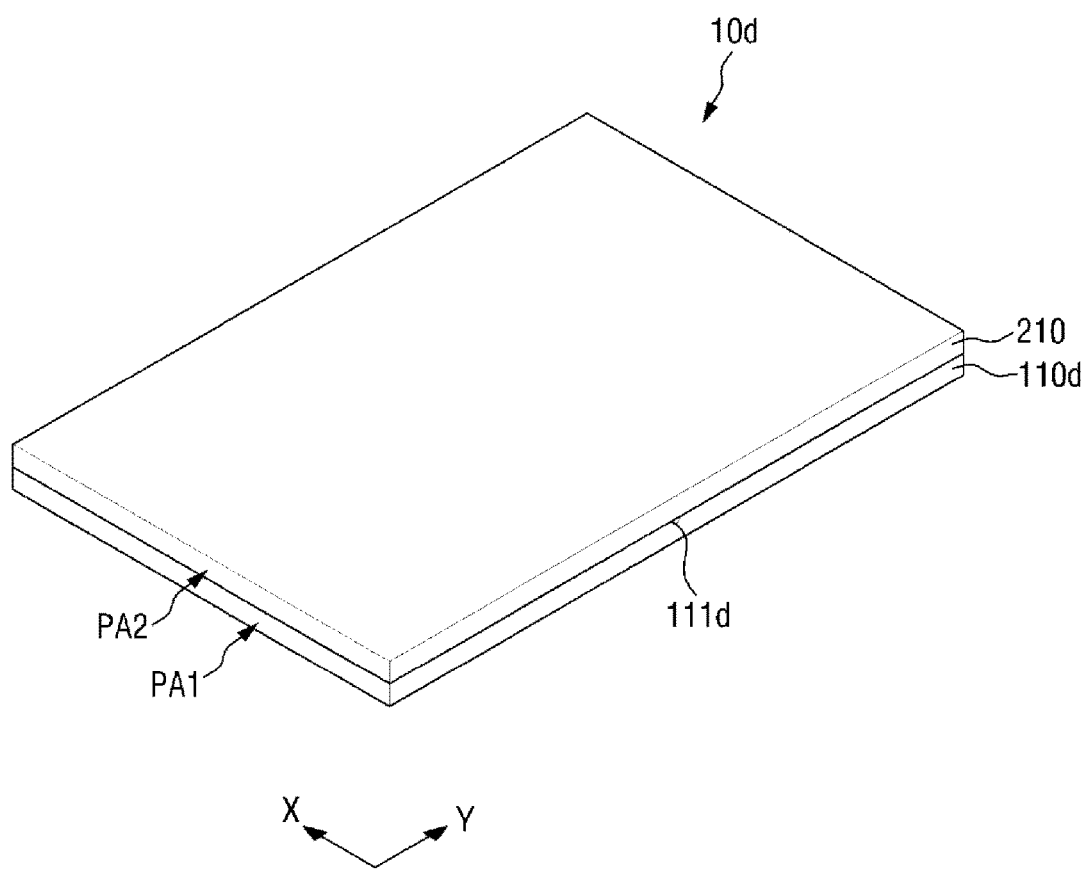
FIG. 10 is a perspective view of a display panel in a bonded state, according to one or more exemplary embodiments.

FIG. 10 is a perspective view of a display panel in a bonded state, according to one or more exemplary embodiments.

Referring to FIG. 10, in comparison with display panel 10 of FIG. 1, display panel 10*d* has features similar to display panel 10 of FIG. 1. However, display panel 10*d* includes crack guide groove 111*d* formed on a surface of first substrate 110*d* that faces second substrate 210. Accordingly, features of crack guide groove 111*d* will be described in more detail with reference to FIG. 10.

Crack guide groove 111*d* may be formed on an inner surface of first substrate 110*d* that faces second substrate 210. Crack guide groove 111*d* may have a relatively small size in comparison with the thickness of first substrate 110*a* so that crack guide groove 111*d* does not increase the risk of breaking first substrate 110*a* by an impact which generate stresses on first substrate 110*a* lower than the stresses generated on display panel 10 when display panel 10 bends more than a bending threshold that could generate a defect of displaying a distorted image.

Although not illustrated, crack guide groove 111*d* may be formed in the same manner as the configuration in which crack guide groove 111 is formed, for example, the solid line shape as shown in FIG. 4, the dotted line shape as shown in FIG. 7, the partial line grooves formed on opposite edge portions of first substrate 110*b* as shown in FIG. 8, and the parallel solid lines as shown in FIG. 9.

Further, crack guide groove 111*d* may be formed to have parallel dotted lines or multiple partial line grooves at opposite edge portions of first substrate 110*c* similar to the parallel solid lines shown in FIG. 9.

As described above, display panel 10*d* may include crack guide groove 111*d* that is formed on the inner surface of first substrate 110*d* that faces second substrate 210. This configuration may reduce the risk of crack formation from the impact from outside other than bending of first substrate 110*d*.

Figure 11:
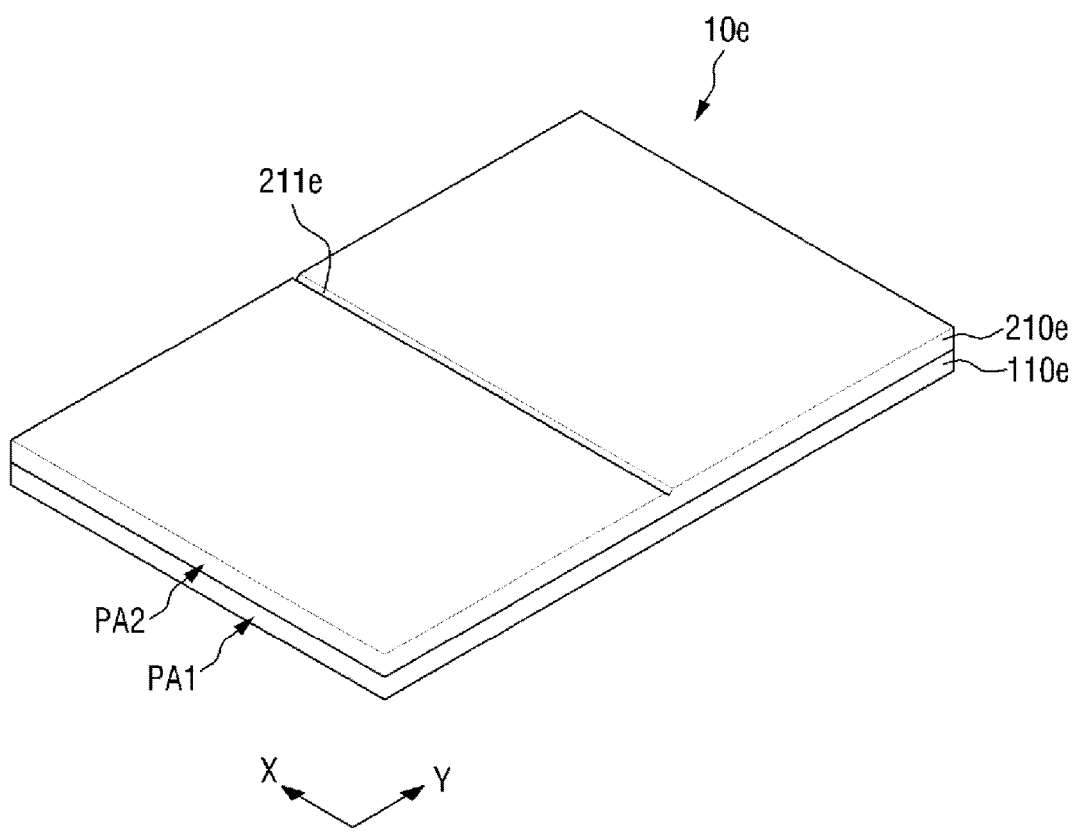
FIG. 11 is a perspective view of a display panel in a bonded state, according to one or more exemplary embodiments.

FIG. 11 is a perspective view of a display panel in a bonded state, according to one or more exemplary embodiments.

Referring to FIG. 11, in comparison with display panel 10 of FIG. 1, display panel 10*e* has a configuration similar to display panel 10 of FIG. 1. However, crack guide groove 211*e* is formed on second substrate 210*e*, which corresponds to second substrate 210, instead of first substrate 110*e*, which corresponds to first substrate 110. Accordingly, features of crack guide groove 211*e* will be described in more detail with reference to FIG. 11.

Crack guide groove 211*e* may be similar to crack guide groove 111 of FIG. 4. However, crack guide groove 211*e* may be formed on a surface (i.e., second outer surface) of second substrate 210*e*, which does not face first substrate 110*e*. Crack guide groove 211*e* may be formed in a solid line shape along first direction X that is substantially in parallel to an edge or a side surface of second substrate 210*e*. In some embodiments, first direction X may be a direction that is substantially in parallel to the shorter edge of second substrate 210*e* or a direction that is substantially perpendicular to the longer edge of second substrate 210*e*. If display panel 10*e* bends in an opposite direction to the bending direction of display panel 10 of FIG. 6, a crack may be formed in the center portion of second substrate 210*e* that receives high stresses to break second substrate 210*e*.

FIG. 11 illustrates that crack guide groove 211*e* may be a groove in a solid line shape that is formed along first direction X. Crack guide groove 211*e* may be formed in the center portion of the second outer surface of second substrate 210*e* or other non-pixel portions as described above. Further, crack guide groove 211*e* may be implemented as a groove in a dotted line shape similar to crack guide groove 111*a* as illustrated in FIG. 7, partial grooves formed on opposite edge portions on the second outer surface similar to crack guide groove 111*b* as illustrated in FIG. 8, or the parallel line grooves similar to crack guide grooves 111*c* as illustrated in FIG. 9. Further, crack guide groove 211*e* may be formed on more than one area of second substrate 210*e* with regular or irregular intervals. For example, parallel dotted lines or multiple partial grooves on opposite edges of second substrate 210*e* may be formed similar to the parallel solid line grooves illustrated in FIG. 9.

As described above, display panel 10*e* may include crack guide groove 211*e* that is formed on the second outer surface of second substrate 210*e*, and if the bending deformation of display panel 10*e* occurs, e.g., in the process of manufacturing a display device, crack guide groove 211*e* may cause a crack to be formed along crack guide groove 211*e*, which makes the corresponding portion of second substrate 210*e* more likely generate the crack when second substrate 210*e* bends more than a certain bending degree. Accordingly, display panel 10*e* having unwanted bending deformation can be more easily discovered in early stages in the process of manufacturing a display device.

Figure 12:
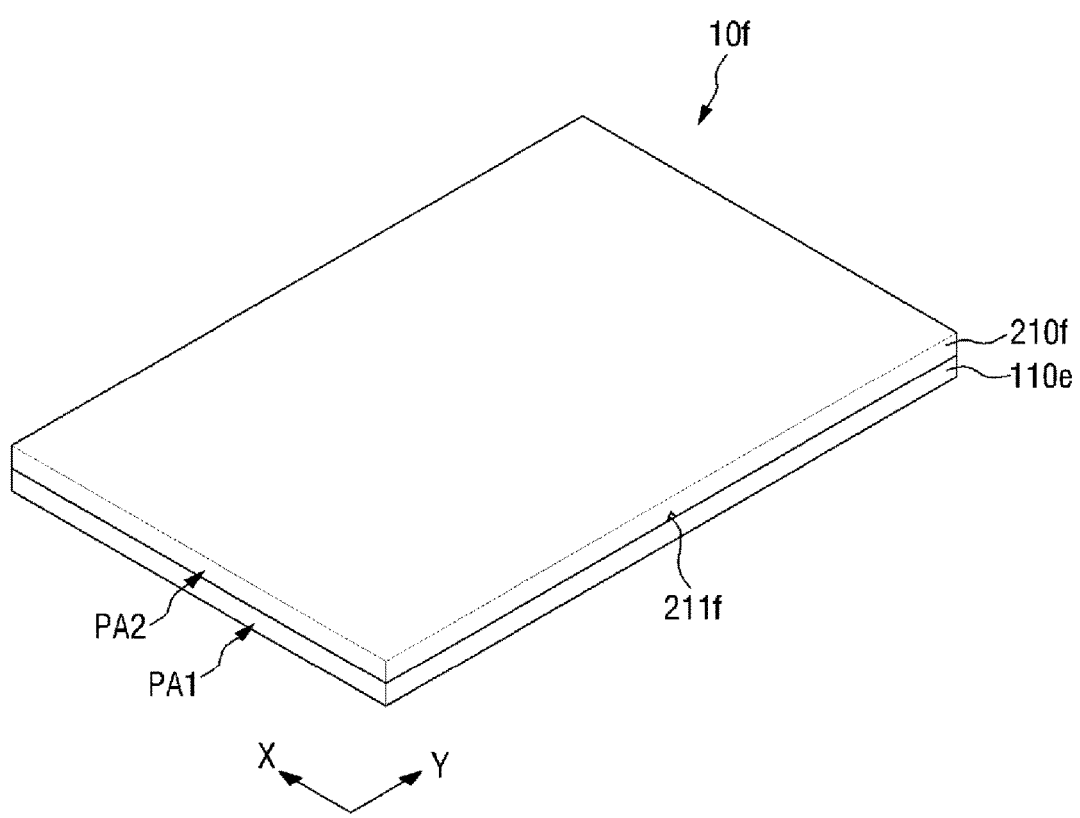
FIG. 12 is a perspective view of a display panel in a bonded state, according to one or more exemplary embodiments.

FIG. 12 is a perspective view of a display panel in a bonded state, according to one or more exemplary embodiments.

Referring to FIG. 12, in comparison with display panel 10 of FIG. 1, display panel 10*f* has a configuration similar to display panel 10 of FIG. 1. However, crack guide groove 21 if is formed on second substrate 210*f*, which corresponds to second substrate 210, instead of first substrate 110*f*, which corresponds to first substrate 110. Accordingly, features of crack guide groove 211*f* will be described in more detail with reference to FIG. 12.

Crack guide groove 211*f* may be similar to crack guide groove 111 of FIG. 4. However, crack guide groove 211*f* may be formed on an inner surface of second substrate 210*f* that faces first substrate 110*e*. Crack guide groove 211*f* may have a size smaller than the thickness of second substrate 210*f* so that such configuration prevents second substrate 210*f* from being easily broken by an external impact other than bending. However, crack guide groove 211*f* may facilitate the crack generation along crack guide groove 211*f* when second substrate 210*f* bends more than a certain bending degree.

Although not illustrated, crack guide groove 211*f* may have various shapes, such as a solid line, a dotted line, a partial groove formed on opposite edges of second substrate 210*f*, and the like, as described above. Further, crack guide groove 211*f* may be formed on multiple areas in the inner surface of second substrate 210*f* with certain intervals as shown in e.g., FIG. 9.

As described above, display panel 10*f* may include crack guide groove 211*f* that is formed on the second inner surface of second substrate 210*f* that faces first substrate 110*e*, and thus second substrate 210f may be less vulnerable to an external impact, which can break display panel 10f.

Figure 13:
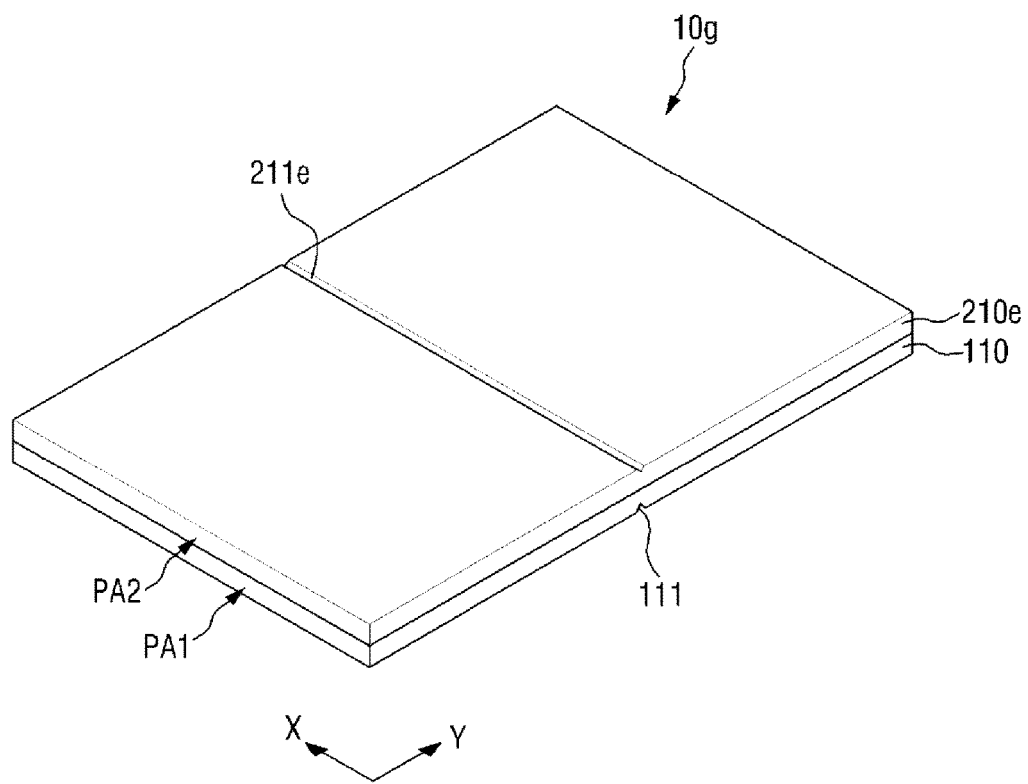
FIG. 13 is a perspective view of a display panel in a bonded state, according to one or more exemplary embodiments.

FIG. 13 is a perspective view of a display panel in a bonded state, according to one or more exemplary embodiments.

Referring to FIG. 13, in comparison with display panel 10 of FIG. 1 and display panel 10e of FIG. 11, display panel 10g has crack guide groove 111 on first substrate 110 and crack guide groove 211e on second substrate 210e.

If the display panel 10g bens in the same direction as the bending direction of display panel 10 as illustrated in FIG. 6, crack guide groove 111 may cause first substrate 110 to generate a crack. If display panel 10g bends in the opposite direction to the bending direction of display panel 10 as illustrated in FIG. 6, crack guide groove 211e may cause second substrate 210 to generate a crank.

As described above, display panel 10g may include crack guide groove 111 formed on the surface of first substrate 110 and crack guide groove 211eformed on second substrate 210e, and thus first substrate 110 or second substrate 210emay generate a crack when display panel 10g bends regardless of the bending direction of display panel 10g . In exemplary embodiments, crack guide grooves can be disposed on each inner surface of the first and second substrates or disposed on an inner surface of one substrate and an outer surface of the other substrate.

Figure 14:
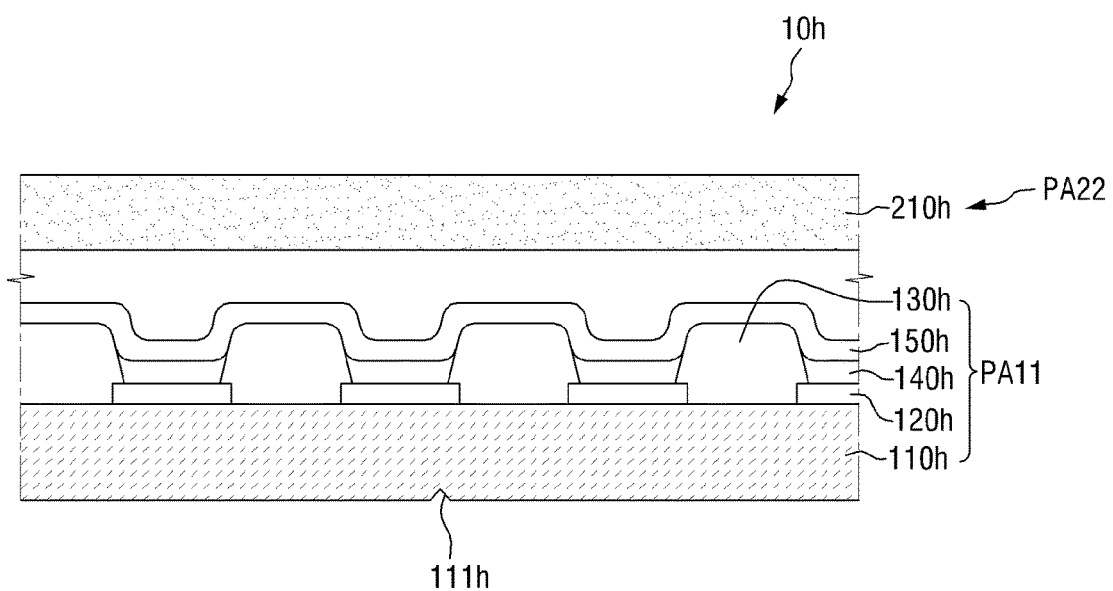
FIG. 14 is a cross-sectional view of a display panel in a bonded state, according to one or more exemplary embodiments.

FIG. 14 is a cross-sectional view of a display panel in a bonded state, according to one or more exemplary embodiments.

Referring to FIG. 14, display panel 10h may be a display panel of an organic light emitting display.

Display panel 10h may include first panel PA11 and second panel PA22 that faces first panel PA11.

First panel PA11 may include first substrate 110h, first electrode 120h, pixel-defining layer 130h, organic layer 140h, and second electrode 150h.

First substrate (e.g., "a thin film transistor array substrate") 110h may include a material having superior permeability, heat resistance, and chemical resistance.

Although not illustrated, first substrate 110h may further include other elements and/or layers. Examples of the other elements and/or layers may include a wiring, an electrode, an insulating layer, and a thin film transistor. A drain electrode of the thin film transistor may be electrically connected to first electrode 120h.

First substrate 110h may be in a flat shape, and may include crack guide groove 111h that is formed on a surface thereof. Crack guide groove 111h may be formed in the center portion of first substrate 110h. The shape of crack guide groove 111h may be the same as the shape of crack guide groove 111 of FIG. 1. Crack guide groove 111h may provide the same features as the features of crack guide groove 111 of FIG. 1. More specifically, if display panel 10h bends in the same direction as the bending direction of display panel 10 as illustrated in FIG. 6, crack guide groove 111h may cause a crack to be formed in the center portion of first substrate 110h that receives the highest stresses to break first substrate 110h. Accordingly, display panel 10h having unwanted bending deformation may be discovered relatively easily due to the formation of the crack in early stages in the process of manufacturing a display device. Display panel 10h, which has unwanted bending deformation in the process of manufacturing a display device and may display a distorted image, can be found in early stages before completing the manufacturing process.

Although not illustrated, crack guide groove 111h may be formed in the same manner as the configuration in which crack guide groove 111 is formed as the groove in the solid line shape as shown in FIG. 4, the configuration in which crack guide groove 111a is formed in the dotted line shape as shown in FIG. 7, the configuration in which crack guide groove 111b is formed in opposite edge portions of first substrate 110b in the solid line shape as shown in FIG. 8, and the configuration in which crack guide grooves 111c are formed in the solid line shape as shown in FIG. 9. Further, crack guide grooves 111h may be formed in the same manner as the configuration in which crack guide grooves 111c are formed in the dotted line shape or in the partial solid line shape in opposite edge portions of first substrate 110c . If crack guide groove 111h has the same shape as the shape of crack guide grooves 111c in FIG. 9, each portion of crack guide groove 111h may overlap a part of the pixel-defining layer 130h.

First electrode 120h may be formed for each pixel on first substrate 110h. First electrode 120h may be an anode electrode that receives a signal that is applied to the drain electrode of the thin film transistor and provides holes to organic layer 140h or a cathode electrode that provides electrons. In one or more exemplary embodiments, first electrode 120h may be the anode electrode. If first electrode 120h is used as a reflective electrode, the organic light emitting display may be a top emission type organic light emitting display in which light that comes from organic layer 140h is emitted in the direction of second electrode 150h.

Pixel-defining layer 130h may be formed on first substrate 110h on which first electrode 120h is formed. Pixel-defining layer 130h may be arranged on a pixel boundary to discriminate respective pixels. Pixel-defining layer 130h may have an opening for providing an arrangement space of organic layer 140h, and is formed in an area that corresponds to a non-pixel area of first substrate 110h. First electrode 120h may be exposed by the opening of the pixel-defining layer 130h, and in this case, a side portion of first electrode 120h may extend toward pixel-defining layer 130h to partially overlap the pixel-defining layer 130h. According to the positional relationship between pixel-defining layer 130h and first electrode 120h in the area where pixel-defining layer 130h and first electrode 120h overlap each other, pixel-defining layer 130h may be an upper portion of first electrode 120h based on first substrate 110h.

Pixel-defining layer 130h may include an insulating material. Specifically, pixel-defining layer 130h may include at least one organic material selected from the group including benzo cyclo butene (BCB), polyimide (PI), poly amaide (PA), acrylic resin, and phenol resin. As another example, pixel-defining layer 130h may include an inorganic material, such as silicon nitride.

Organic layer 140h may be formed on first electrode 120h. Specifically, organic layer 140h may be formed in the opening of pixel-defining layer 130h to extend to cover a part of an upper portion of pixel-defining layer 130h. Organic layer 140h may include an organic light emitting layer that substantially emits light through recombination of holes provided from first electrode 120h and electrons provided from second electrode 150h. More specifically, if holes and electrons are provided into the organic light emitting layer, the holes and the electrons are combined to form excitons, and the light is emitted as the excitons are shifted from an excitation state to a ground state.

Second electrode 150h may be formed on organic layer 140h, and may be a cathode electrode that provides electrons to organic layer 140h or an anode electrode that provides holes thereto. In an example, second electrode 150h may be a cathode electrode.

Second panel PA22 may include second substrate 210h.

Second substrate 210h may include an insulating substrate including a material having superior permeability, heat resistance, and chemical resistance, and may be in a flat shape. In some embodiments, second substrate 210h may be omitted. In this case, an encapsulation layer including an insulating material may cover the whole structure to protect elements in the structure.

Although not illustrated, second panel PA22 may further include a spacer (not illustrated) that is arranged between second substrate 210h and first substrate 110h.

As described above, display panel 10h may include crack guide groove 111h formed on the surface of first substrate 110h, and if the bending deformation of display panel 10h occurs in the process of manufacturing a display device, crack guide groove 111h may cause crack CR to be formed in the center portion of first substrate 110h that receives the highest stresses to break first substrate 110h. Accordingly, display panel 10h having unwanted bending deformation can be found in early stages in the process of manufacturing a display device.

Further, although FIG. 14 illustrates that crack guide groove 111h is formed on first substrate 110h, a crack guide groove may also be formed on second substrate 210h, for example similar to crack guide grooves 211e and 211f as illustrated in FIG. 11 and FIG. 12. Further, crack guide groove 111h of FIG. 14 may be formed on both first substrate 110h and second substrate 210h, for example similar to crack guide grooves 111 and 211e as illustrated in FIG. 13.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display panel comprising:
   a first substrate comprising a pixel area and a non-pixel area;
   a second substrate that faces the first substrate;
   a first crack guide groove disposed on a first surface of the first substrate, the first surface of the first substrate facing away from the second substrate; and
   a second crack guide groove disposed on a second surface of the second substrate, the second surface of the second substrate facing away from the first substrate,
   wherein a depth of the first and second crack guide grooves are equal to or smaller than one tenth of a thickness of the first substrate and the second substrate.

2. The display panel of claim 1, wherein the first and second crack guide grooves have at least one of a solid line shape and a dotted line shape along a first direction.

3. The display panel of claim 1, wherein crack guide groove portions are disposed in opposite edge portions of the at least one of the first substrate and the second substrate,
   wherein a first crack guide groove portion and a second crack guide groove portion of the crack guide groove are disposed in the opposite edge portions, respectively, and
   wherein the first crack guide groove portion and the second crack guide groove portion are separated in a first direction and substantially aligned relative to a second direction substantially perpendicular to the first direction.

4. The display panel of claim 1, wherein a cross section shape of the first and second crack guide grooves are selected from a group consisting of a triangle and a rectangle.

5. The display panel of claim 1, wherein the first substrate and the second substrate are substantially flat and the first substrate and the second substrate are configured to generate a crack along the crack guide groove when bent more than a threshold bending degree.

6. A display panel comprising:
   a first substrate comprising a pixel area and a non-pixel area;
   a second substrate that faces the first substrate;
   a first crack guide groove disposed on a first surface of the first substrate, the first surface of the first substrate facing away from the second substrate; and
   a second crack guide groove disposed on a second surface of the second substrate, the second surface of the second substrate facing away from the first substrate,
   wherein the crack guide groove extends along a first direction on the surface of the first substrate and the second substrate, and
   wherein the first and second crack guide grooves are disposed on a center of the first substrate and the second substrate, respectively, with respect to a direction substantially perpendicular to the first direction.

7. A display panel comprising:
   a first substrate comprising a pixel area and a non-pixel area;
   a second substrate that faces the first substrate;
   a first crack guide groove disposed on a first surface of the first substrate, the first surface of the first substrate facing away from the second substrate; and
   a second crack guide groove disposed on a second surface of the second substrate, the second surface of the second substrate facing away from the first substrate,
   wherein the first crack guide groove comprises a plurality of first crack guides disposed along a first direction on the first surface of the first substrate,
   wherein the second crack guide groove comprises a plurality of second crack guides disposed along a first direction on the second surface of the second substrate, and
   wherein the crack guide grooves are spaced apart from each other along a second direction substantially perpendicular to the first direction.

8. A display panel comprising:
   a first substrate comprising a pixel area and a non-pixel area;
   a second substrate that faces the first substrate;
   a first crack guide groove disposed on a first surface of the first substrate, the first surface of the first substrate facing away from the second substrate;
   a second crack guide groove disposed on a second surface of the second substrate, the second surface of the second substrate facing away from the first substrate;
   a liquid crystal layer interposed between the first substrate and the second substrate; and
   a black matrix arranged in an area corresponding to the non-pixel area,
   wherein the first and second crack guide grooves overlap a part of the black matrix.

9. The display panel of claim 1, further comprising:
a light emitting layer disposed between the first substrate and the second substrate, the light emitting layer disposed in an area corresponding to the pixel area; and
a pixel-defining layer disposed in an area corresponding to the non-pixel area,
wherein the first and second crack guide grooves overlap a part of the pixel-defining layer.

* * * * *